United States Patent
Heller et al.

(10) Patent No.: US 11,469,720 B2
(45) Date of Patent: Oct. 11, 2022

(54) SPLIT-STEER AMPLIFIER WITH INVERTIBLE OUTPUT

(71) Applicant: Ay Dee Kay LLC, Aliso Viejo, CA (US)

(72) Inventors: Tom Heller, Karmiel (IL); Yanir Schwartz, Haifa (IL); Oded Katz, Ganei-Tikva (IL)

(73) Assignee: AyDee Kay LLC, Aliso Viejo, CA (US)

( * ) Notice: Subject to any disclaimer, the term of this patent is extended or adjusted under 35 U.S.C. 154(b) by 56 days.

(21) Appl. No.: 17/011,106

(22) Filed: Sep. 3, 2020

(65) Prior Publication Data

US 2022/0006432 A1 Jan. 6, 2022

Related U.S. Application Data

(60) Provisional application No. 63/047,110, filed on Jul. 1, 2020.

(51) Int. Cl.
*H03F 3/45* (2006.01)
*H03F 3/193* (2006.01)
*G01S 13/931* (2020.01)
*G01S 13/08* (2006.01)

(52) U.S. Cl.
CPC ............. *H03F 3/193* (2013.01); *G01S 13/08* (2013.01); *G01S 13/931* (2013.01); *G01S 2013/9314* (2013.01); *H03F 2200/451* (2013.01)

(58) Field of Classification Search
CPC ...... H03F 3/45; H03F 3/195; H03F 2200/451; H03F 3/72
USPC .................................. 330/254, 51; 327/359
See application file for complete search history.

(56) References Cited

U.S. PATENT DOCUMENTS 5,157,350 A * 10/1992 Rubens .................. G06G 7/163
330/254
8,050,649 B2 * 11/2011 Chen .................... H03D 7/1483
455/326

* cited by examiner

*Primary Examiner* — Henry Choe
(74) *Attorney, Agent, or Firm* — Steven Stupp

(57) ABSTRACT

A split-steer amplifier with an invertible phase output, includes a first transistor having its base coupled to a positive node of an input port, its emitter coupled to ground, and collector connected to a positive intermediate node; a second transistor having its base coupled to a negative node of the input port, its emitter coupled to ground, and collector connected to a negative intermediate node; and multiple output ports each having a transistor arrangement operable to couple a positive node of that output port to the positive intermediate node and a negative node of that output port to the negative intermediate node, operable to couple the positive node of that output port to the negative intermediate node and the negative node of that output port to the positive intermediate node, and operable to decouple the positive node and the negative node of that output port from the intermediate nodes.

20 Claims, 8 Drawing Sheets

SPLIT-STEER AMPLIFIER WITH INVERTIBLE OUTPUT

CROSS-REFERENCE TO RELATED APPLICATIONS

This application claims the benefit of U.S. Provisional Patent Application No. 63/047,110, filed on Jul. 1, 2020, the entire contents of which is incorporated herein by reference.

The present application is related to U.S. patent application Ser. No. 16/801,406, filed Feb. 26, 2020 and U.S. patent application Ser. No. 16/453,033, filed Jun. 26, 2019, both of which are entirely incorporated by reference herein.

BACKGROUND

In multi-input, multi-output (MIMO) radar systems, provision for time-division multiplexing (TDM) and code-division multiplexing (CDM) involves the use of binary phase-shift keying (BPSK) modulator circuits, such as Gilbert cell-based BPSK modulators. While these modulator circuits are effective, there nevertheless remains room for improvement in the art.

SUMMARY

Accordingly, there are disclosed herein split-steer amplifiers with one or more invertible outputs suitable for use in multi-input downconversion mixers, systems, and methods with receive antenna multiplexing.

One illustrative embodiment of this disclosure is a split-steer amplifier with at least one output having an invertible phase, the amplifier including: a first input transistor having its base coupled to a positive node of an input port, its emitter coupled to ground, and its collector connected to a positive intermediate node; a second input transistor having its base coupled to a negative node of the input port, its emitter coupled to ground, and its collector connected to a negative intermediate node; and multiple output ports each having a transistor arrangement that: when enabled with a first polarity, couples a positive node of that output port to the positive intermediate node and couples a negative node of that output port to the negative intermediate node; when enabled with a second polarity, couples the positive node of that output port to the negative intermediate node and couples the negative node of that output port to the positive intermediate node; and when disabled, decouples the positive node and the negative node of that output port from each of the positive and negative intermediate nodes, the bases of the first and second input transistors being biased to provide quiescent current $m*I_0$ when m of the multiple output ports are enabled.

Another illustrative embodiment of this disclosure is a method of operating an amplification circuit, the method including: coupling a base of a first input transistor of the amplification circuit to a positive node of an input port, coupling an emitter of the first input transistor to ground, and coupling the collector of the first input transistor to a positive intermediate node; coupling a base of a second input transistor of the amplification circuit to a negative node of the input port, coupling the emitter of the second transistor to ground, and coupling the collector of the second amplification circuit to a negative intermediate node; enabling a selected one of multiple output ports with a first polarity by coupling a positive node of the selected output port to the positive intermediate node and coupling a negative node of the selected output port to the negative intermediate node; inverting the polarity of the selected output port by coupling the positive node of the selected output port to the negative intermediate node and coupling the negative node of the selected output port to the positive intermediate node; and biasing the bases of the first and second input transistors to provide quiescent current $m*I_0$ when m of the multiple output ports are enabled.

DETAILED DESCRIPTION

Please note that the drawings and corresponding detailed description are provided for explanatory purposes, not to limit the disclosure. To the contrary, they provide the foundation for understanding all modifications, equivalents, and alternatives falling within the scope of the appended claims.

Figure 1:
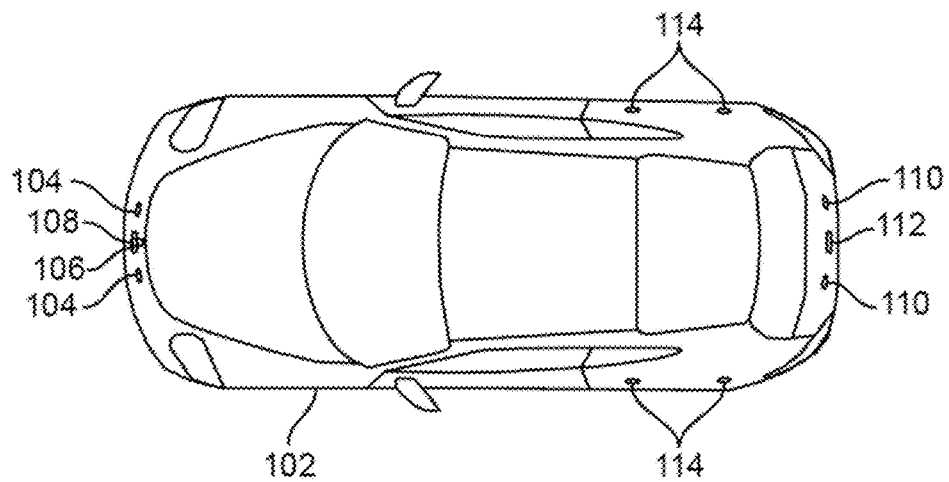
FIG. 1 is an overhead view of an illustrative vehicle equipped with sensors.

FIG. 1 shows an illustrative vehicle 102 equipped with an array of radar antennas, including antennas 104 for short range sensing (e.g., for park assist), antennas 106 for midrange sensing (e.g., for monitoring stop and go traffic and cut-in events), antennas 108 for long range sensing (e.g., for adaptive cruise control and collision warning), each of which may be placed behind the front bumper cover. Antennas 110 for short range sensing (e.g., for back-up assist) and antennas 112 for midrange sensing (e.g., for rear collision warning) may be placed behind the cover of the rear bumper. Antennas 114 for short range sensing (e.g., for blind spot monitoring and side obstacle detection) may be placed behind the car fenders. Each set of antennas may perform multiple-input multiple-output (MIMO) radar sensing. The type, number, and configuration of sensors in the sensor arrangement varies for vehicles having driver-assist and self-driving features. The vehicle may employ the sensor arrangement for detecting and measuring distances/directions to objects in the various detection zones to enable the vehicle to navigate while avoiding other vehicles and obstacles.

Figure 2:
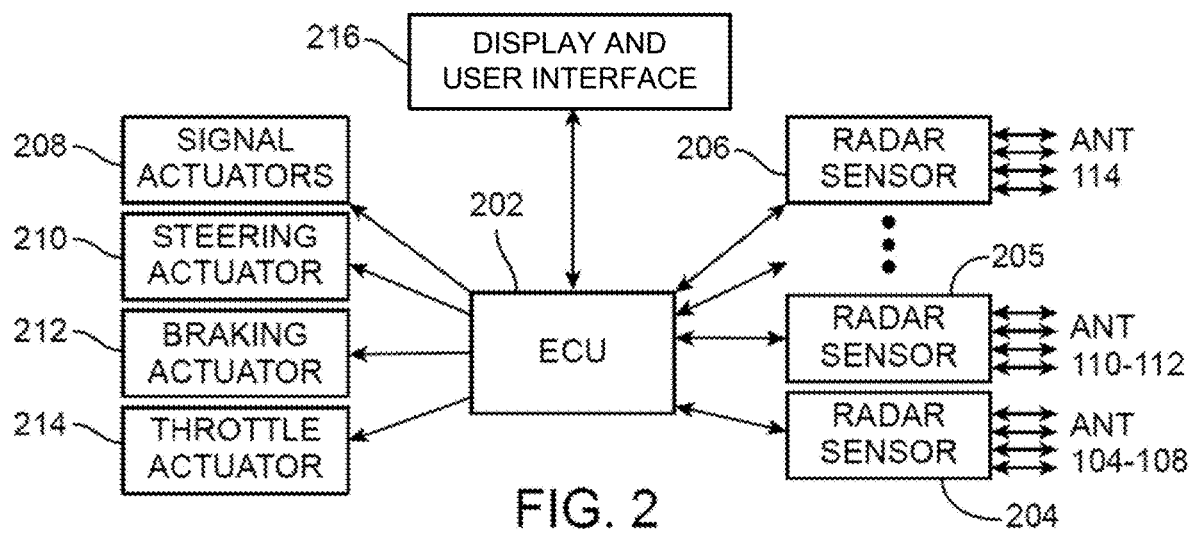
FIG. 2 is a block diagram of an illustrative driver-assistance system.

FIG. 2 shows an electronic control unit (ECU) 202 of a vehicle (e.g., 102) coupled to various radar sensors 204-206 as the center of a star topology. Of course, other topologies including serial, parallel, and hierarchical (tree) topologies, are also suitable and contemplated for use in accordance with the principles disclosed herein. The radar sensors 204-206 each include a radio frequency (RF) front end which couples to some of the transmit and receive antennas 104-114 to transmit electromagnetic waves, receive reflections, and determine a spatial relationship of the vehicle to its surroundings. To provide automated parking assistance, the ECU 202 may further connect to a set of actuators such as a turn-signal actuator 208, a steering actuator 210, a braking actuator 212, and throttle actuator 214. ECU 202 may further couple to a user-interactive interface 216 to accept user input and provide a display of the various measurements and system status, acting on the status and incoming information to actuate various signaling and control transducers as needed to provide automated parking, assisted parking, lane-change assistance, obstacle and blind-spot detection, autonomous driving, lane following, automatic braking, and other desirable features.

Radar systems operate by emitting electromagnetic waves which travel outward from the transmit antenna before being reflected to a receive antenna. The reflector can be any moderately reflective object in the path of the emitted electromagnetic waves. By measuring the travel time of the electromagnetic waves from the transmit antenna to the reflector and back to the receive antenna, the radar system can determine the distance to the reflector and its radial velocity relative to the radar. In MIMO radar sensing, multiple transmit or receive antennas are used with more sophisticated processing to enable tracking of distance and direction to multiple reflectors. At least some radar systems employ array processing to "scan" a directional beam of electromagnetic waves and construct an image of the vehicle's surroundings. Both pulsed and continuous-wave implementations of radar systems can be implemented, though frequency modulated continuous wave radar systems are generally preferred for accuracy.

Figure 3:
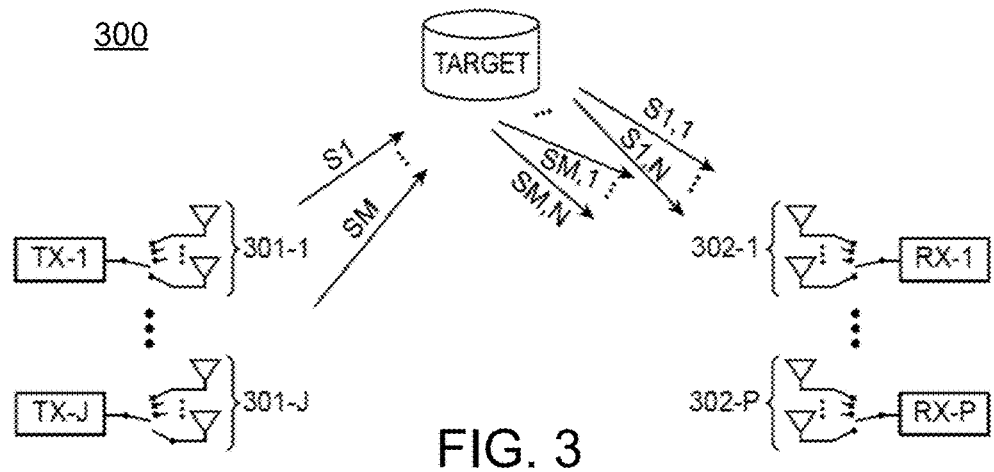
FIG. 3 is a schematic of an illustrative reconfigurable MIMO radar system.

FIG. 3 shows an illustrative reconfigurable MIMO radar system 300 in which M transmit antennas 301 can each be selectively coupled to one of J<M transmitters, and N receive antennas 302 can each be selectively coupled to P<N receivers, enabling N*M measurements to be obtained by only J transmitters and P receivers, thereby maintaining measurement diversity of the system while significantly reducing the system's size and cost. In at least one embodiment of this disclosure, the number of transmitters and receivers may be maintained while increasing the number of antennas to significantly improve the performance of the system 300 without substantially increasing the system's cost. The available antennas 301, 302 can be systematically multiplexed to the available transmitters and receivers to collect the full set of measurements for radar imaging.

Figure 4:
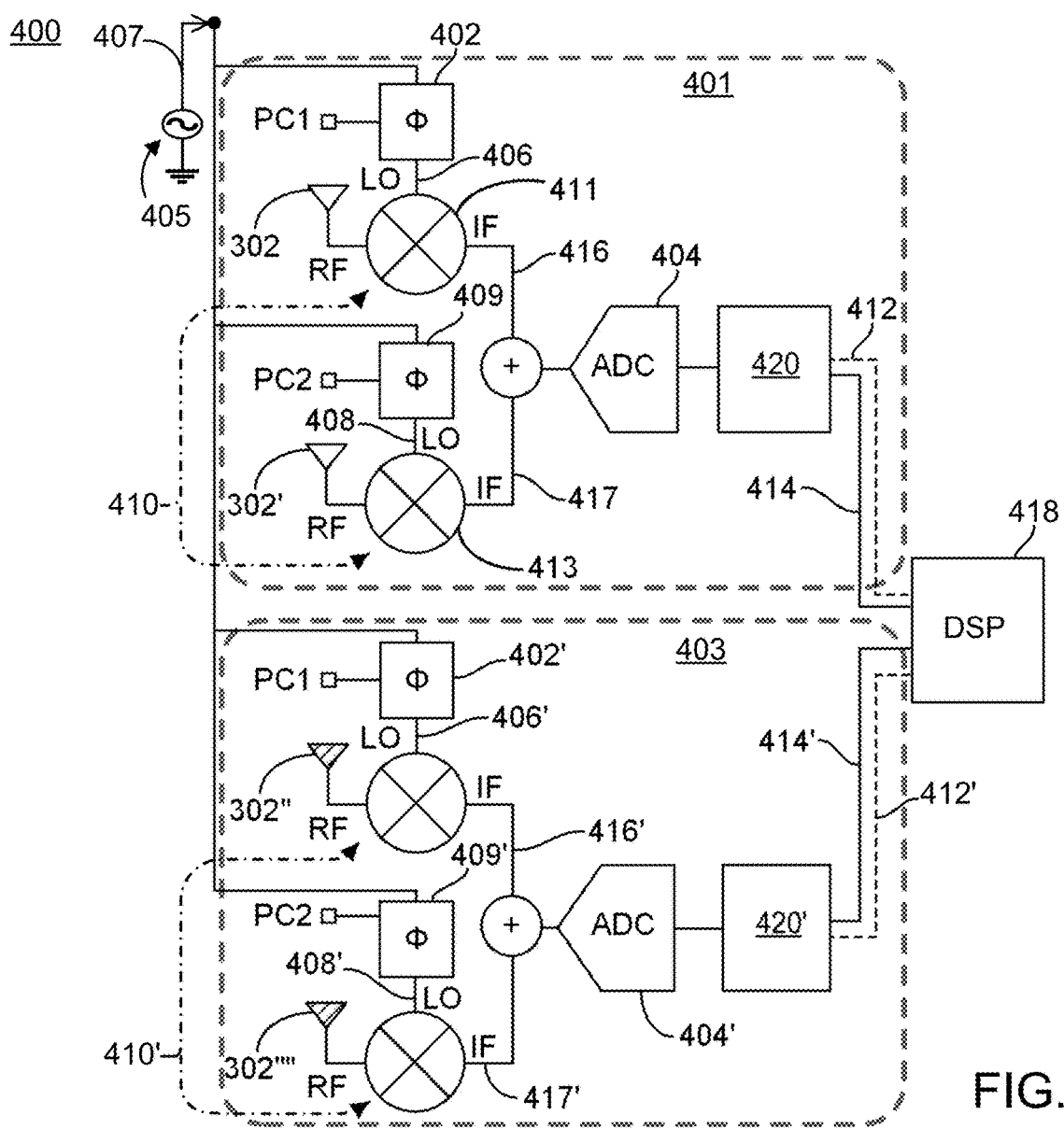
FIG. 4 is a schematic of an illustrative MIMO beamforming receiver with antenna multiplexing.

FIG. 4 is a schematic of an illustrative configuration for a multi-input digital beamforming receiver array 400 with antenna multiplexing. Receiver array 400 comprises two receivers, receiver 401 and receiver 403. In receiver array 400, local oscillator (LO) 405 generates an oscillation signal 407, which is received by phase shifters 402, 409 of receiver 401, and phase shifters 402', 409' of receiver 403. (The primed components 402'-420' in receiver 403 correspond to the unprimed components 402-420 of receiver 401.) Phase shifters 402, 409 modulate the oscillation signal 407 using orthogonal phase codes, supplying the modulated oscillation signal to the LO inputs 406, 408 of each mixer pair 410 to down convert the received signals to intermediate frequency (IF). The orthogonal phase coding provides code division multiplexing, so that the down converted intermediate frequency (IF) signals 416, 417 are later separable, enabling determination of each receive antenna's contribution. The IF signals 416, 417 are summed, and then sampled by the analog-to-digital converter (ADC) 404. A demodulator unit 420, or a demodulation algorithm in the DSP unit 418, operates on the sampled signal to separate the digital signals 412, 414 corresponding to the down converted IF signals 416, 417 (respectively) so that each waveform can be associated with the antenna 302 from which it originates. The DSP 418 can receive and process both waveforms concurrently.

As shown, two (2) phase shifters/modulators 402, 402' receive a first phase code, PC1, and two (2) phase shifters/modulators 409, 409' receive a second phase code, PC2. The number of orthogonal phase codes is equal to the number of mixers that are connected to each ADC 404. The quantity of orthogonal codes for the configuration 440 of FIG. 4 is thus two (2). Thus the FIG. 4 configuration 400 enables operation of a MIMO receiver in a code-division multiplexing (CDM) mode, which doubles spatial resolution without degrading velocity measurement.

Operation is also possible in a time-division multiplexing (TDM) mode. In TDM mode, only one of the mixers in a mixer pair (e.g., either 411 or 413) is enabled at a given time and phase code modulation is unnecessary for separating receive antenna contributions. In TDM mode, a mixer's IF output is sampled by the ADC 404 and routed to the radar DSP unit 418 for estimation of the range, velocity, and direction of one or more targets. The DSP 418 iterates through each of the mixers coupled to a given ADC 404, enabling each in turn to determine the measurements associated with that antenna.

Though the phase code modulation is unnecessary for separating receive antenna contributions in TDM mode, it may nevertheless be useful for separating transmitter contributions. Where different transmitters employ orthogonal coding (e.g., bi-phase shift keying or "BPSK"), the phase shifters 402, 409 may be used to screen out various sources of signal interference.

The phase shifters 402, 409 need not be conventional BPSK modulators such as a Gilbert cell-based BPSK modulator. By providing for BPSK functionality without a BPSK modulator, embodiments of this disclosure provide for TDM and CDM functionality in a receiver that is smaller than has previously been possible.

Figure 5:
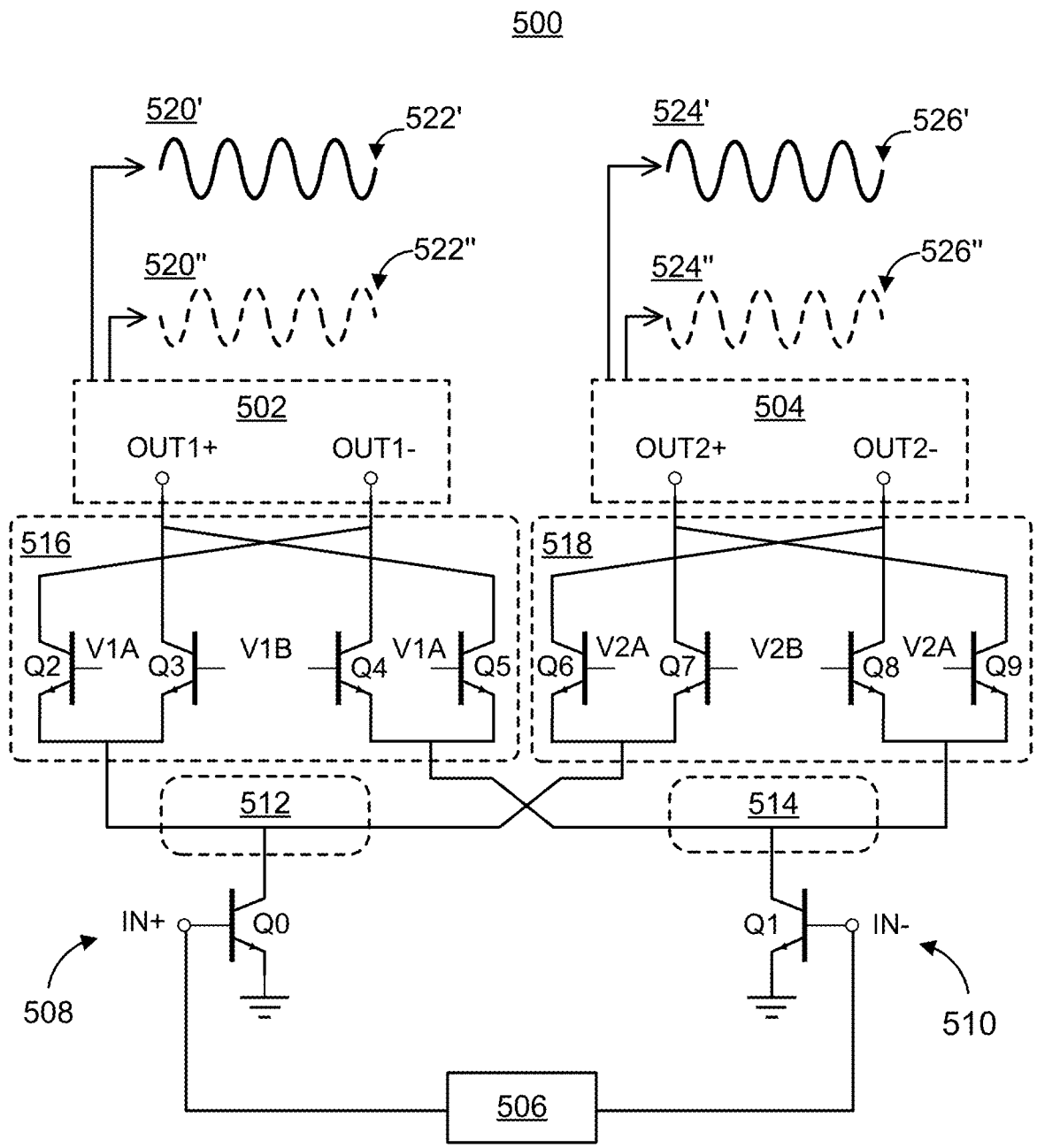
FIG. 5 illustrates a contemplated embodiment of a phase-inverting split-steer amplifier (PI-SSA).

FIG. 5 illustrates a contemplated embodiment of a phase-inverting split-steer amplifier (PI-SSA) 500. The PI-SSA 500 has two output ports, output port 502 and output port 504. PI-SSA 500 has one input port 506 which in at least one configuration of PI-SSA 500 accepts a differential input signal (in+, in−). The input port 506 has a positive node 508 and a negative node 510. The positive node 508 of input port 506 is connected to the base or gate of a transistor Q0. The negative node 510 of input port 506 is connected to the base or gate of a transistor Q1. The PI-SSA 500 can deliver a first differential output signal 520 (out1+, out1−) from output port 502 and a second differential signal 524 (out2+, out2−) from output port 504 based on the differential input signal (in+, in−). In at least one embodiment, the differential input signal (in+, in−) is received from a local oscillator, (e.g., 405).

As noted, the PI-SSA 500 includes two input transistors, transistor Q0 and transistor Q1. The base or gate of transistor Q0 is coupled to the positive node 508 of the input port 506. The emitter or drain of transistor Q0 is coupled to ground, and the collector or source of transistor Q0 is connected to a positive intermediate node 512. The base or gate of transistor Q1 is coupled to the negative node 510 of the input port 506. The emitter or drain of transistor Q1 is coupled to ground, and the collector or source of transistor Q0 is connected to a negative intermediate node 514.

The PI-SSA 500 includes two transistor arrangements, e.g., transistor array 516 and transistor array 518. In at least one embodiment, when transistor array 516 is enabled with a first polarity, transistor array 516 couples positive node OUT1+ of output port 502 to the positive intermediate node 512 and couples the negative node OUT1− of output port 502 to the negative intermediate node 514. Output port 502 can generate a first output signal 520. When transistor array 516 is enabled with a second polarity, transistor array 516 couples the positive node OUT1+ of output port 502 to the negative intermediate node 514 and couples the negative node OUT1− of output port 502 to the positive intermediate node 512. Thus, the phase 522 of output signal 520 from output port 502 can be inverted by changing the polarity of transistor array 516, such as from the first polarity of transistor array 516 to the second polarity of transistor array 516, or from the second polarity of transistor array 516 to the first polarity of transistor array 516.

In one or more embodiments, when transistor array 516 is disabled, transistor array 516 decouples the positive node OUT1+ of output port 502 from the positive intermediate node 512 and negative intermediate node 514. In one or more embodiments, when transistor array 516 is disabled, transistor array 516 decouples the negative node OUT1− of output port 502 from the positive intermediate node 512 and negative intermediate node 514.

In at least one embodiment, when transistor array 518 is enabled with a first polarity, transistor array 518 couples positive node OUT2+ of output port 504 to the positive intermediate node 512 and couples the negative node OUT2− of output port 504 to the negative intermediate node 514. When transistor array 518 is enabled with a second polarity, transistor array 518 couples the positive node OUT2+ of output port 504 to the negative intermediate node 514 and couples the negative node OUT2− of output port 504 to the positive intermediate node 512. Like output port 502, the phase 526 of the output signal 524 from output port 504 can be inverted by changing the polarity of transistor array 518, such as from a first polarity of transistor array 518 to a second polarity of transistor array 518, or from a second polarity of transistor array 518 to a first polarity of transistor array 518.

In one or more embodiments, when transistor array 518 is disabled, transistor array 518 decouples the positive node OUT2+ of output port 504 from the positive intermediate node 512 and from negative intermediate node 514. In one or more embodiments, when transistor array 518 is disabled, transistor array 518 decouples the negative node OUT2− of output port 504 from the positive intermediate node 512 and negative intermediate node 514.

Though FIG. 5 shows only two output ports, the principle can be extended to provide more output ports, each output port having a corresponding transistor array that couples the output port nodes to the positive and negative intermediate nodes in a fashion controlled by the desired enablement status and polarity for that port.

In at least one embodiment, the base or gate of transistor Q0 and the base or gate of transistor Q1 are biased to provide quiescent current $m*I_O$ when m of the multiple output ports (e.g., 502, 504) are enabled. Thus, when output port 502 is enabled and output port 504 is not enabled—such as when transistor array 518 is disabled and transistor array 518 has decoupled the positive node OUT2+ of output port 504 and the negative node OUT2− of output port 504 from the positive intermediate node 512 and the negative intermediate node 514—quiescent current $I_O$ is delivered to transistor array 516. Similarly when output port 504 is enabled and output port 502 is not enabled—such as when transistor array 516 is disabled and transistor array 516 has decoupled the positive node OUT1+ of output port 502 and the negative node OUT1− of output port 502 from the positive intermediate node 512 and the negative intermediate node 514— quiescent current $I_O$ is delivered to transistor array 518. When both output port 502 and output port 504 are enabled, the base or gate of transistor Q0 and the base or gate of transistor Q1 deliver $2*I_O$ to the positive intermediate node 512 and the negative intermediate node 514 collectively, and so transistor array 516 and transistor array 518 each receive $I_O$.

Transistor array 516 includes four common-base (CB) or common-gate (CG) transistors, transistor Q2, transistor Q3, transistor Q4, and transistor Q5. The base or gate of transistor Q2 and the base or gate of transistor Q5 are connected to base or gate voltage V1A. The base or gate transistor Q3 and the base or gate of transistor Q4 are connected to base or gate voltage V1B.

Transistor array 518 includes four common-base (CB) or common-gate (CG) transistors, transistor Q6, transistor Q7, transistor Q8, and transistor Q9. The base or gate transistor Q6 and the base or gate of transistor Q9 are connected to base or gate voltage V2A. The base or gate transistor Q7 and the base or gate of transistor Q8 are connected to base or gate voltage V2B.

Transistor Q0 and transistor Q1 form a differential common-emitter (CE) or common-drain (CD) pair which drives CB or CG transistors Q2-Q5 of transistor array 516, and CB or CG transistors Q6-Q9 of transistor array 518. The differential signal between the shorted collector terminals or source terminals of transistors Q2, Q3, Q4 and Q5 forms the output signal 520 of output port 502, and the differential signal between the shorted collector terminals or source terminals of transistor Q6, Q7, Q8, and Q9 forms the output signal 524 from output port 504.

The voltages V1A, V1B, V2A, and V2B can be set to a high voltage level (VH), in which case transistors Q2 and Q5, transistors Q3 and Q4, transistors Q6 and Q9, and transistors Q7 and Q8, respectively, are enabled. Alternately, voltages V1A, V1B, V2A, and V2B can be set to a lower voltage level (VL), in which case transistors Q2 and Q5, transistors Q3 and Q4, transistors Q6 and Q9, and transistors Q7 and Q8, respectively, are disabled.

When V1A is set to VH, transistor Q2 and transistor Q5 are enabled. When V1A is set to VL, transistor Q2 and transistor Q5 are disabled. When V1B is set to VH, transistor Q3 and transistor Q4 are enabled. When V1B is set to VL, transistor Q3 and transistor Q4 are disabled. When V2A is set to VH, transistor Q6 and transistor Q9 are enabled. When V2A is set to VL, transistor Q6 and transistor Q9 are disabled. When V2B is set to VH, transistor Q7 and transistor Q8 are enabled. When V2B is set to VL, transistor Q7 and transistor Q8 are disabled.

The polarity of the signal 520 from output port 502 and polarity of the signal 524 from output port 504 can be altered by changing VA and VB (from VH to VL or from VL to VH). For example, the polarity (e.g., 522') of the signal 520 from output port 502 when V1A is set to VH and V1B is set to VL is opposite the polarity (e.g., 522") of the signal 520 from output port 502 when V1A is VL and V1B is VH. Similarly, the polarity (e.g., 526') of the signal 524 from output port 504 when V2A is VH and V2B is VL is opposite to the polarity (e.g., 526") of output port 504 when V2A is VL and V2B is VH. Thus, as noted, the phases 522, 526 of the signals 520, 524 from output port 502 and output port 504 can each be inverted independently of the other.

Figure 6:
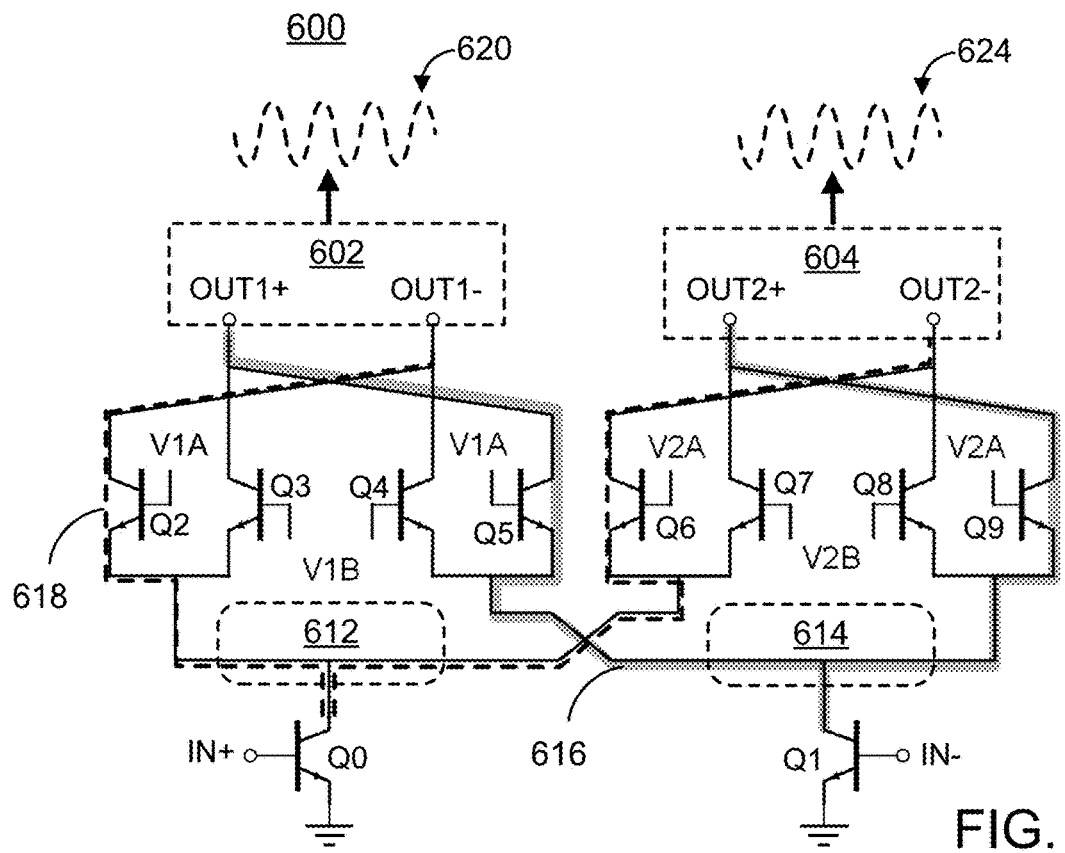
FIG. 6 illustrates a first current flow arrangement in the PI-SSA.

FIG. 6 illustrates a contemplated embodiment of a PI-SSA (e.g., 500) operating in a first split mode configuration 600 in which the signal 620 (e.g., 520) delivered by output port 602 (e.g., 502) is inverted and the output signal 624 delivered by output port 604 (e.g., 504) is inverted. In this configuration, V1A is set to VH and V2A is set to VH, whereas V1B is set to VL and V2B is set to VL. In this split mode configuration, the PI-SSA (e.g., 500) can enable a receiver (e.g., 401) to perform CDM. The positive node OUT1+ of output port 602 and the positive node OUT2+ of output port 604 are connected to the negative intermediate node 614 (e.g., 514). The negative node OUT1− of output port 602 and the negative node OUT2− of output port 604 are connected to the positive intermediate node 612. The positive node OUT1+ of output port 602 and the positive node OUT2+ of output port 604 receive current 616 from transistor Q1. The negative node OUT1− of output port 602 and the negative node OUT2− of output port 604 receive current 618 from transistor Q0.

Figure 7:
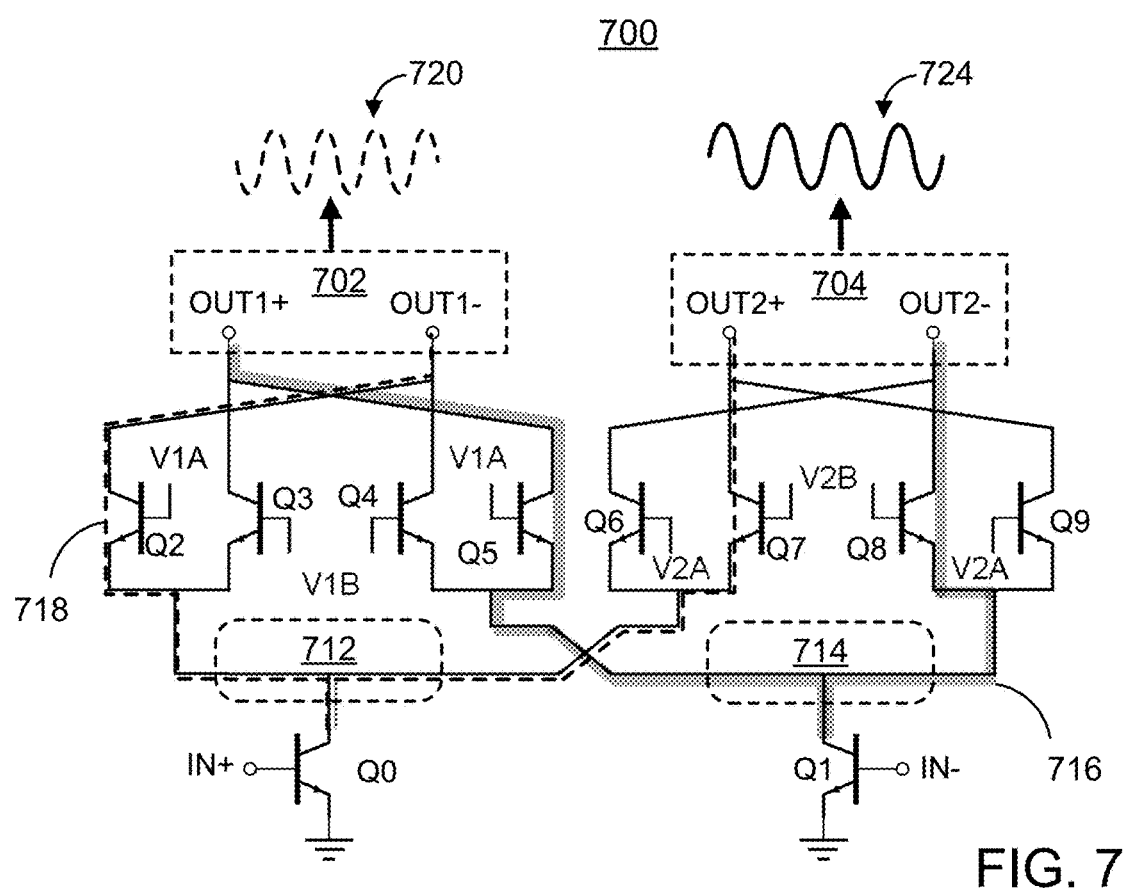
FIG. 7 illustrates a second current flow arrangement in the PI-SSA.

FIG. 7 illustrates a contemplated embodiment of a PI-SSA (e.g., 500) operating in a second split mode configuration 700 in which the signal 720 (e.g., from output port 702 (e.g., 502) is inverted and the signal 724 (e.g., 524) delivered by output port 704 (e.g., 504) is non-inverted. In this configuration, V1A is set to VH and V2B is set to VH, while V1B is set to VL and V2A is set to VL. Like the first split mode configuration 600 of FIG. 6, the split mode configuration 700 of FIG. 7 can enable a receiver (e.g., 401) to perform CDM. The positive node OUT1+ output port 702 and the negative node OUT2− output port 704 are connected to the negative intermediate node 714 (e.g., 514). In FIG. 7, the negative node OUT1− of output port 702 and the positive node OUT2+ output port 704 are connected to the positive intermediate node 712 (e.g., 512). The positive node OUT1+ of output port 702 and the negative node OUT2− of output port 704 receive current 716 from transistor Q1. The negative node OUT1− of output port 702 and the positive node OUT2+ of output port 704 receive current 718 from transistor Q0.

Figure 8:
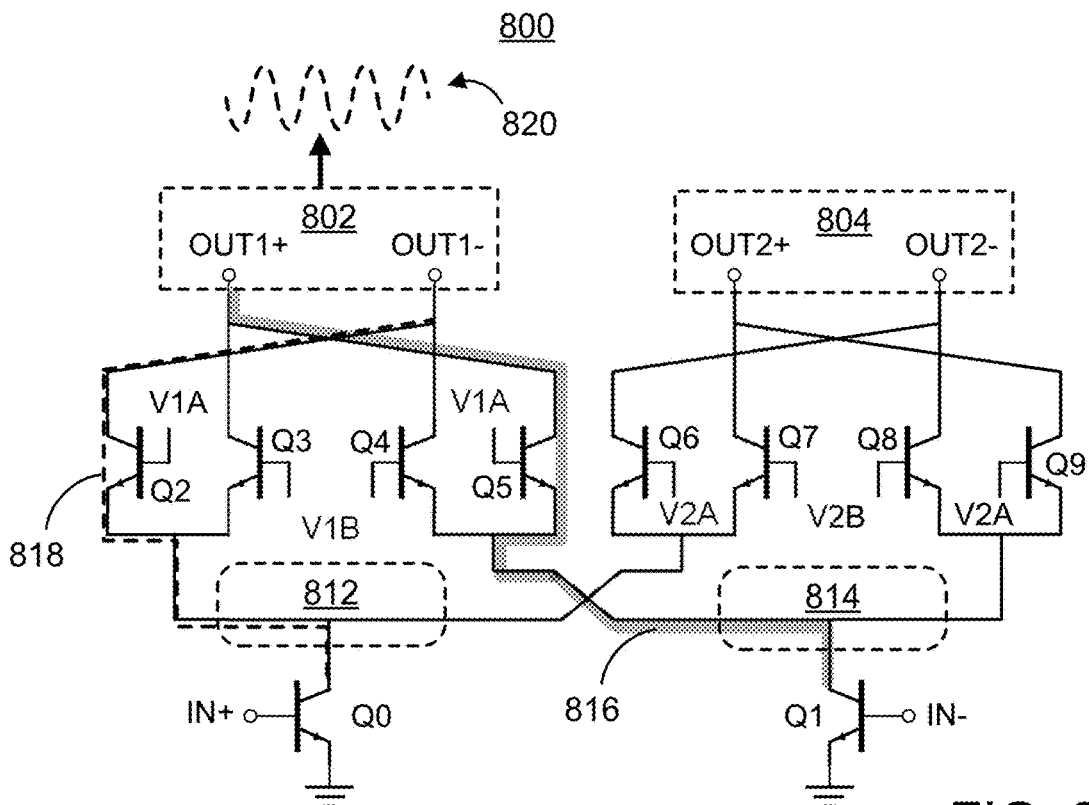
FIG. 8 illustrates a third current flow arrangement in the PI-SSA.

FIG. 8 illustrates a contemplated embodiment of a PI-SSA (e.g., 500) operating in a first steer mode configuration 800 in which the signal 820 delivered by from output port 802 is inverted and output port 804 emits no signal. In this configuration 800, V1A is set to VH, and V2A, V1B and V2B are set to VL. The positive node OUT1+ of output port 802 (e.g., 502) is coupled to the negative intermediate node 814 (e.g., 514), and the negative node OUT1− of output port 802 is connected to the positive intermediate node 812 (e.g., 512). In the first steer mode configuration 800 of FIG. 8, the positive node OUT1+ of output port 802 receives current 816 from transistor Q1, and negative node OUT1− of output port 802 receives current 818 from transistor Q0.

Figure 9:
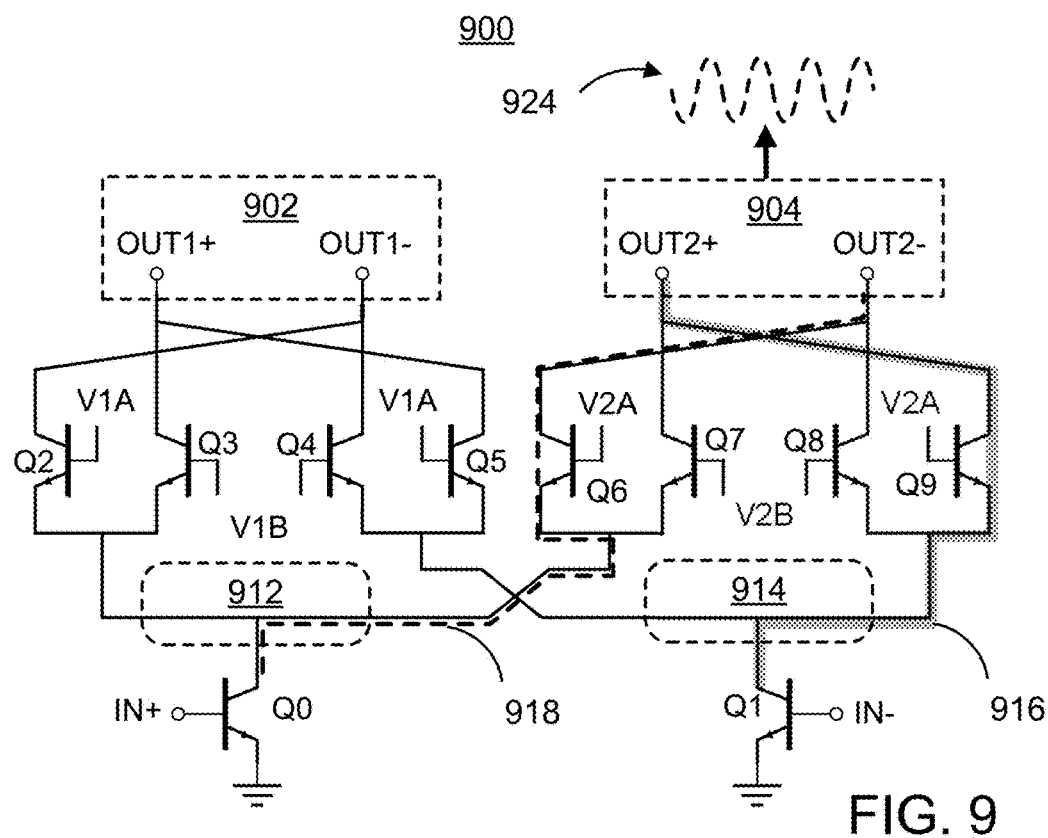
FIG. 9 illustrates a fourth current flow arrangement in the PI-SSA.

FIG. 9 illustrates a contemplated embodiment of a PI-SSA (e.g., 500) in a second steer mode configuration 900 in which the signal 924 (e.g., 524) delivered from output port 904 (e.g., 504) is inverted and output port 902 (e.g., 502) emits no signal. In this configuration 900, V2A is set to VH, and V1A, V1B and V2B are set to VL. The positive node OUT2+ of output port 904 is connected to the negative intermediate node 914 (e.g., 514), and the negative node OUT2− of output port 904 is connected to the positive intermediate node 912 (e.g., 512). The positive node OUT2+ of output port 904 receives current 916 from transistor Q1 and the negative node OUT2− of output port 904 receives current 918 transistor Q0.

FIGS. 5-9 have been drawn using the bipolar NPN symbol for each of the transistors, but it should be recognized that other transistor implementations are contemplated for use. The circuits illustrated in FIGS. 5-9 can also be readily adapted to employ bipolar PNPs, P-channel MOSFETs, CMOS, and other known transistor implementations.

Figure 10:
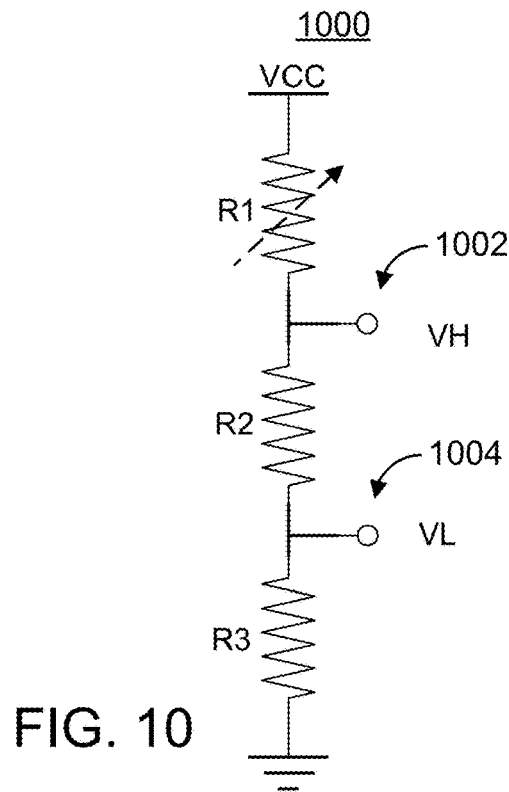
FIG. 10 illustrates a resistive voltage divider circuit that can be used to generate control voltages for the PI-SSA.

FIG. 10 illustrates a resistive voltage divider circuit 1000 that can be used to generate VH and VL. The circuit 1000 contains three series resistive elements connecting a supply voltage VCC to ground. Resistor R1 is connected to resistor R2 at a first node 1002. R2 is connected to R3 at a second node 1004. The voltage drop from the first node 1002 to ground is VH, and the voltage drop from the second node 1004 to ground is VL. In at least one embodiment of this disclosure, VH and VL can be controlled by varying supply voltage VCC. In at least one embodiment of this disclosure, the resistor R1 can be a variable resistor and the values of VH and VL can be controlled by varying the resistance of resistor R1.

Figure 11A:
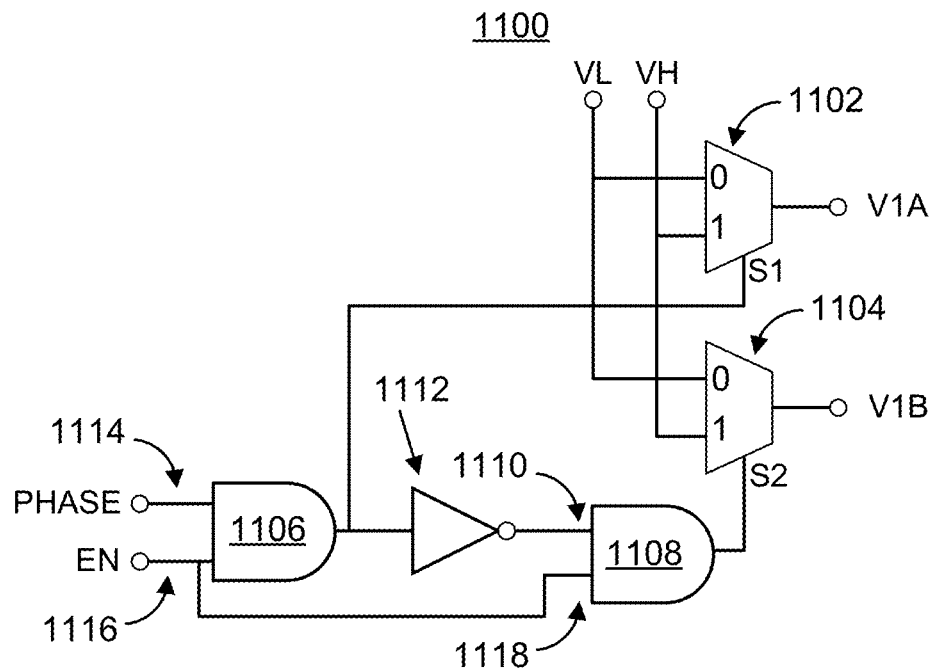
FIGS. 11A-B are schematics of an illustrative bias circuit for the output transistors of the PI-SSA.

FIG. 11A is a logic circuit 1100 that can be used to set the value of V1A of a first transistor array (e.g., 516) to either VH or VL and used to set the value of V1B of the first transistor array (e.g., 516) to VH or VL. Logic circuit 1100 includes two multiplexers, multiplexer 1102 and multiplexer 1104. Logic circuit 1100 includes a first AND gate 1106, and a second AND gate 1106. Interposed between the output of AND gate 1106 and a first input port 1110 of AND gate 1108 is an inverter 1112. Thus, AND gate 1108 receives the inverted output from AND gate 1106 at input port 1110.

At input node 1114, the AND gate 1106 receives a one-bit phase signal indicating a desired polarity for transistor array 516. At input node 1116, the AND gate 1106 receives a one-bit enable signal, which is also conveyed to input node 1118 of AND gate 1108. Similar bit phase and enable signals for transistor array 518 are provided to the logic circuit in FIG. 11B. Taken together, the number of bits in the enable signal (and in the phase signal) corresponds to the number of output ports, so as to provide independent control for each of the output ports.

The enable signal enables or disables the signal (V1A) from multiplexer 1102 and the signal (V1B) from multiplexer 1104. The phase signal controls the phase of V1A of transistor Q2 and transistor Q5 and (due to inverter 1112) inversely controls the phase of V1B of transistor Q3 and Q4.

Multiplexer 1102 and multiplexer 1104 each receive VL and VH at their respective inputs. In one or more embodiments of this disclosure, the base or gate voltages V1A/V2A and V1B/V2B of output port 502 and output port 504 of PI-SSA 500 are set according to the VH or VL voltages selected by multiplexer 1102 and multiplexer 1104. Multiplexer 1102 selects VL as output when it receives logic zero at its selector S1 and multiplexer 1102 selects VH as output when it receives logic 1 at its selector input. Multiplexer 1104 selects VL as output when it receives logic zero at its selector S2 and multiplexer 1104 selects VH as output when it receives logic 1 at its selector input. If the enable bit is logic zero, then both multiplexers 1102, 1104 select VL, disabling the output port. If the enable bit is logic one and phase bit is logic zero, then multiplexer 1102 selects VL and multiplexer 1104 selects VH, enabling the output port with a positive polarity (positive output port node is coupled to positive intermediate node and negative output port node is coupled to negative intermediate node). If the enable bit is logic one and phase bit is logic one, multiplexer 1102 selects VH and multiplexer 1104 selects VL, enabling the output port with a negative polarity.

Figure 11B:
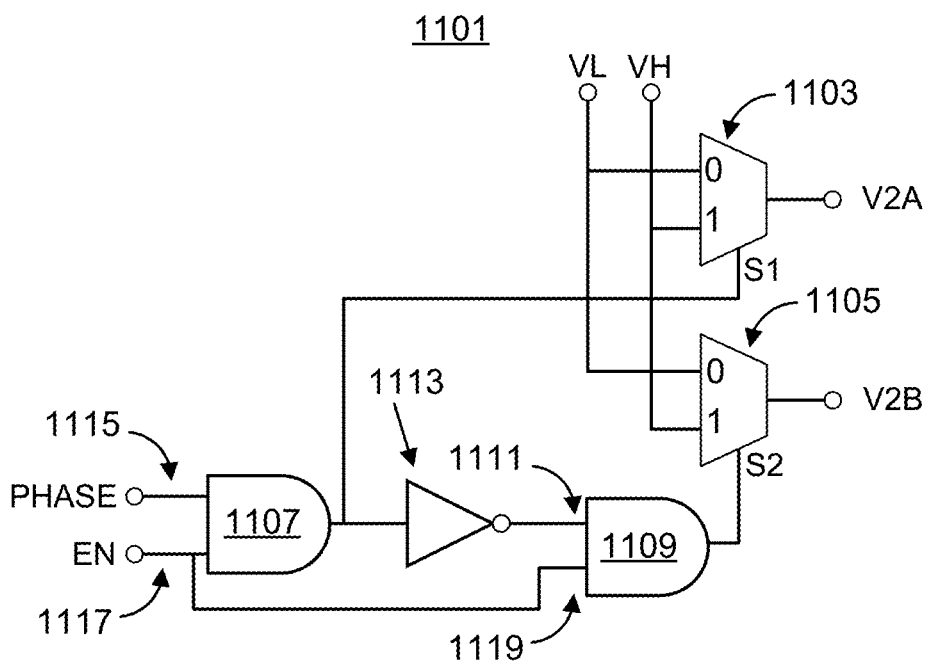

FIG. 11B shows a logic circuit 1101 that is a duplicate of circuit 1100 but accepts the enablement and phase signals for the second transistor array 518. Logic circuit 1101 includes two multiplexers, multiplexer 1103 and multiplexer 1105. Logic circuit 1101 includes a first AND gate 1107, and a second AND gate 1109. Interposed between the output of AND gate 1107 and a first input port 1111 of AND gate 1109 is an inverter 1113. Thus, AND gate 1109 receives the inverted output from AND gate 1107 at input port 1111.

Figure 12:
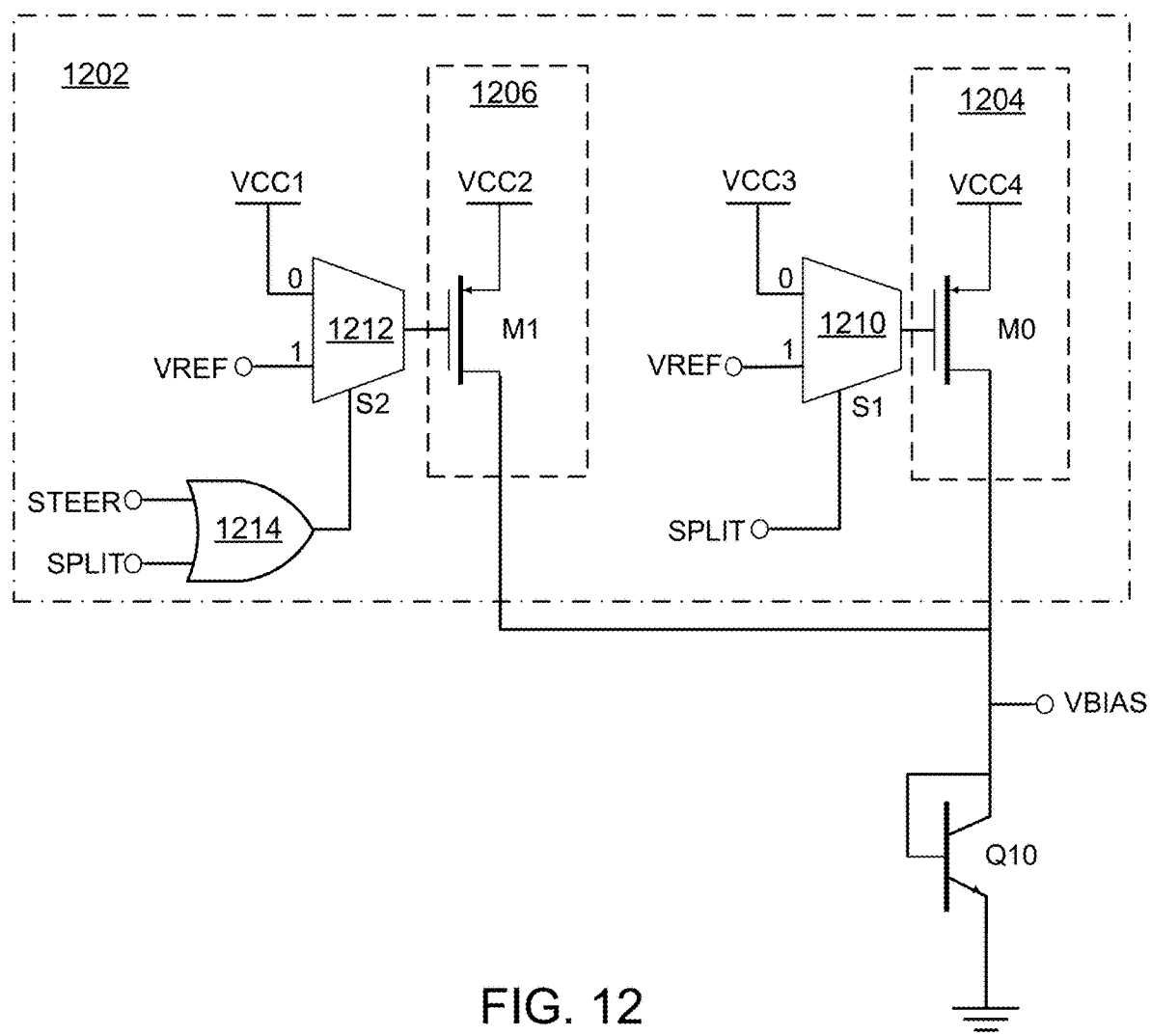
FIG. 12 is a schematic of an illustrative bias circuit for the input transistors of the PI-SSA.

As with logic circuit 1100, if the enable bit is logic zero, then both multiplexers 1103, 1105 select VL, disabling the output port. If the enable bit is logic one and phase bit is logic zero, then multiplexer 1103 selects VL and multiplexer 1105 selects VH, enabling the output port with a positive polarity (positive output port node is coupled to positive intermediate node and negative output port node is coupled to negative intermediate node). If the enable bit is logic one and phase bit is logic one, multiplexer 1103 selects VH and multiplexer 1105 selects VL, enabling the output port with a negative polarity FIG. 12 illustrates a biasing circuit 1200 to control the biasing current of transistor Q0 and transistor Q1. In at least one embodiment, biasing circuit 1200 includes a Vbias node. In some embodiments, the circuit 1200 generates a voltage from the Vbias node to ground, which is coupled to the bases (or gates) of transistor Q0 and transistor Q1. (To enable biasing of the bases of Q0, Q1, the input port nodes may be capacitively or inductively coupled to the source of the input signal.)

Circuit 1200 includes a transistor Q10 configured to operate as a current mirror diode. The base-emitter voltage of transistor Q10 is set by programmable current source 1202 which includes two programmable current circuits 1204, 1206. The first programmable current circuit 1204 includes p-channel metal-oxide-semiconductor field effect transistor (PFET) M0, and the second programmable current circuit 1206 includes PFET M1. Transistor M0 and transistor M1 act as current sources, both of which are controlled by a 1-bit Enable input.

The source (or emitter) terminal of transistor M0 is connected to supply voltage VCC, and the drain (or collector) terminal of transistor M0 is connected to the gate (or base) terminal of transistor Q10 and the drain (or collector) terminal of transistor Q10. The gate (or base) terminal of transistor M0 is connected to the output of a first multiplexer 1210. The multiplexer 1210 has two input terminals and a selector terminal S1. The first input terminal of multiplexer 1210 is connected to VCC and the second terminal is connected to a reference voltage Vref. The selector terminal S1 of multiplexer 1210 receives either a logic zero or a logic 1, corresponding to a split selection. If the split signal to the multiplexer 1210 is logic 1, the multiplexer 1210 will select Vref as output to the gate (or base) of transistor M0. When the gate voltage of transistor M0 is Vref, transistor M0 allows current to flow from the source terminal of M0 to the drain terminal, which then flows to transistor Q10.

When the split signal is a logic zero, multiplexer 1210 selects VCC as output to the gate of transistor M0, which prevents current from flowing from the source terminal of M0 to the drain (or collector) terminal of M0. That is, if transistor M0 is disabled the PFET gate voltage is set to the supply voltage VCC, disabling the current though transistor M0, in which case current does not flow from transistor M0 to transistor Q10.

The source (or emitter) terminal of transistor M1 is connected to supply voltage VCC, and the drain (or collector) terminal of transistor M1 is connected to the gate (or base) terminal of transistor Q10 and the drain (or collector) terminal of transistor Q10. The gate (or base) terminal of transistor M1 is connected to the output of a second multiplexer 1212. The multiplexer 1212 has two input terminals and a selector terminal S2. The first input terminal of multiplexer 1212 is connected to VCC and the second terminal is connected to a reference voltage Vref. The selector terminal S2 of multiplexer 1212 is connected to the output of an OR gate 1214. The OR gate 1214 has two input ports. The first input node receives either logic zero or logic 1 corresponding to a steer selection. The second input node of the OR gate 1214 receives either logic zero or logic 1 corresponding to a split selection.

If either the split signal or the steer signal (or both) is a logic 1, multiplexer 1212 will select Vref as output to the gate of transistor M1. When the gate voltage of transistor M1 is Vref, transistor M1 allows current to flow from the source terminal to the drain (or collector) terminal, which then flows to transistor Q10. If both the split signal and steer signals are logic zero, multiplexer 1212 selects VCC as output to the gate of transistor M1, which prevents current from flowing from the source terminal to the drain (or collector) terminal. That is, if transistor M1 is disabled the PFET gate voltage of transistor M1 is set to the supply voltage VCC, disabling the current though transistor M1, in which case current does not flow from transistor M1 to transistor Q10.

Thus, if neither the split nor the steer signal is asserted (logic 1), all current flow is suppressed, and the bias voltage drops to ground, disabling the input transistors. If only the steer signal is asserted (logic 1), indicating that only one of the output ports is enabled, programmable current circuit 1206 supplies current to Q10, setting the bias voltage to provide the input transistors of the PI-SSA with a quiescent current $I_0$. If the split signal is asserted, indicating that both output ports are enabled, both programmable current circuits 1204, 1206 supply current to Q10, setting the bias voltage to provide the input transistors with a quiescent current $2I_0$.

Transistor M1 and transistor M0 have been drawn using the P-channel MOSFET symbol, and transistor Q10 has been drawn using a bipolar NPN symbol, but it should be recognized that other transistor implementations are contemplated for use. The circuit illustrated in FIG. 12 can be readily adapted to employ bipolar PNPs, P-channel MOSFETs, CMOS, and other known transistor implementations.

Figure 13:
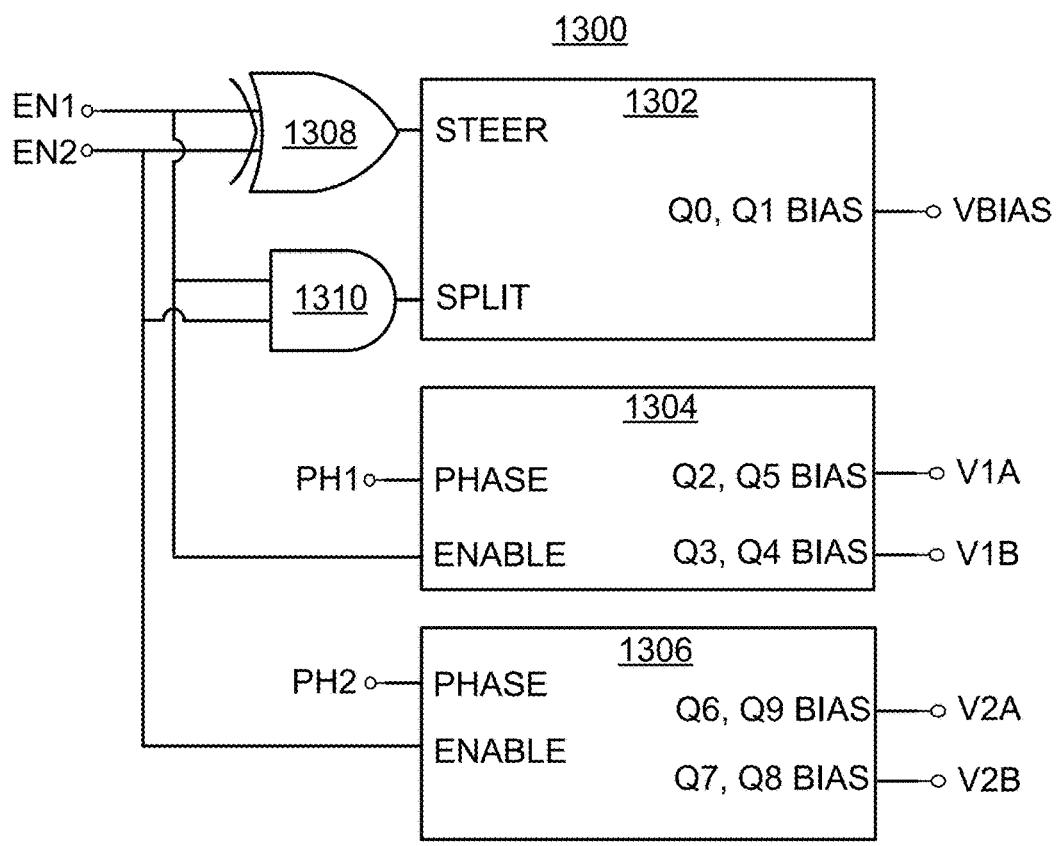
FIG. 13 is a schematic of an illustrative digital controller for setting an operating state of the PI-SSA.

FIG. 13 illustrates a digital controller 1300. Digital controller 1300 has four input terminals and five output terminals. The first input terminal is configured to receive a first enable signal EN1 (logic zero or logic 1), and the second input terminal is configured to receive a second enable signal EN2, (logic zero or logic 1). The third input terminal is configured to receive a first phase signal PH1 (logic zero or logic 1), and the fourth input terminal is configured to receive a second phase signal PH2 (logic zero or logic 1). Signals EN1, PH1 set the desired enablement and phase for the first output port 502, while signals EN2, PH2 set the desired enablement and phase for the second output port 504.

The digital controller 1300 includes a Vbias control circuit 1302 for the input transistors, a V1 control circuit 1304 for the transistor arrangement 516, and a V2 control circuit 1306 for the second transistor arrangement 518. The digital controller 1300 also includes an exclusive-or (XOR) gate 1308 and an AND gate 1310. The XOR gate 1308 is configured to receive EN1 and EN2 to provide the steer signal. The AND gate 1310 is configured to receive EN1 and EN2 and to provide the split signal. The split and steer signals are supplied to the Vbias control circuit 1302 to produce a bias voltage for the input transistors. Circuit 1302 may be implemented as described above with reference to FIG. 12.

V1 control circuit 1304 has two input terminals. The first input terminal of V1 control circuit 1304 is a phase input terminal and is configured to receive PH1. The second input terminal of V1 control circuit 1304 is an enable input terminal and is configured to receive EN1. The V1 control circuit 1304 produces the control voltages V1A, V1B for the first transistor arrangement 516. Circuit 1304 may be implemented as described above with reference to FIG. 11A.

V2 control circuit 1306 also has two input terminals. The first input terminal of V2 control circuit 1306 is a phase input terminal and is configured to receive PH2. The second input terminal of V2 control circuit 1306 is an enable input terminal and is configured to receive EN2. The V2 control circuit 1306 produces the control voltages V2A, V2B for the second transistor arrangement 518. Circuit 1306 may be implemented as described above with reference to FIG. 11B.

The embodiments described are illustrative and non-limiting.

What is claimed is:

1. A split-steer amplifier with at least one output having an invertible phase, the amplifier comprising:
    a first input transistor having its base coupled to a positive node of an input port, its emitter coupled to ground, and its collector connected to a positive intermediate node;
    a second input transistor having its base coupled to a negative node of the input port, its emitter coupled to ground, and its collector connected to a negative intermediate node; and
    multiple output ports each having a transistor arrangement that is configured to:
    when enabled with a first polarity, couple a positive node of that output port to the positive intermediate node and couples a negative node of that output port to the negative intermediate node;
    when enabled with a second polarity, couple the positive node of that output port to the negative intermediate node and couples the negative node of that output port to the positive intermediate node; and
    when disabled, decouple the positive node and the negative node of that output port from each of the positive and negative intermediate nodes, wherein the bases of the first and second input transistors being biased to provide quiescent current m*I0 when m of the multiple output ports are enabled, and
    wherein the enabling of the multiple output ports with the first polarity or the second polarity is associated with an orthogonal phase code that identifies a receive signal corresponding to a receive antenna or identifies a transmit signal corresponding to a transmit antenna.

2. The amplifier of claim 1, wherein m equals two.

3. The amplifier of claim 1, wherein the first input transistor is an NPN bipolar junction transistor and the second input transistor is an NPN bipolar junction transistor.

4. The amplifier of claim 1, wherein the positive node of the input port is configured to a positive component of a differential signal and the negative node of the input port is configured to receive a negative component of the differential signal.

5. The amplifier of claim 4, wherein the differential signal is an oscillation signal generated by a local oscillator.

6. The amplifier of claim 1, wherein a first output port from among the multiple output ports is connected to a first mixer of a mixer pair and a second output port from among the multiple output ports is connected to second mixer of the mixer pair.

7. The amplifier of claim 1, wherein each transistor arrangement comprises a first pair of transistors with their bases coupleable to a first voltage source operable to provide a first voltage and a second voltage, the second voltage being higher than the first voltage, and a second pair of transistors with their bases coupleable to a third voltage and a fourth voltage, the fourth voltage being higher than the third voltage.

8. The amplifier of claim 7, wherein the transistors of the first pair of transistors are NPN bipolar junction transistors and the transistors of the second pair of transistors are NPN bipolar junction transistors.

9. The amplifier of claim 7, wherein coupling the bases of the first pair of transistors to the first voltage and the bases of the second pair of transistors to the fourth voltage enables an output port from among the multiple output ports enables the output port with the first polarity.

10. The amplifier of claim 7, wherein coupling the bases of the first pair of transistors to the second voltage and the bases of the second pair of transistors to the third voltage enables an output port from among the multiple output ports with second first polarity.

11. The amplifier of claim 7, wherein:
    coupling the bases of the first pair of transistors to the first voltage and the bases of the second pair of transistors to the fourth voltage enables an output port from among the multiple output ports enables the output port with the first polarity; and
    coupling the bases of the first pair of transistors to the second voltage and the bases of the second pair of transistors to the third voltage enables an output port from among the multiple output ports with second polarity, the second polarity being 180 degrees opposite the first polarity.

12. The amplifier of claim 7, wherein the first voltage and the third voltage are the same, and wherein the second voltage and the fourth voltage are the same.

13. The amplifier of claim 7, further comprising a digital controller, wherein the digital controller is configured to alternatingly couple the bases of the first pair of transistors to the first voltage while coupling the bases of the second pair of transistors to the fourth voltage, or couple the bases of the first pair of transistors to the second voltage while coupling the bases of the second pair of transistors to the third voltage.

14. The amplifier of claim 13, wherein the number of output ports is two, and wherein the digital controller is further configured to:
    supply a first bias current to the first input transistor and the second input transistor when one output port is enabled and one output port is disabled; and
    supply a second bias current to the first input transistor and the second input transistor when both output ports are enabled, the second bias current being greater than the first bias current.

15. The amplifier of claim 14, wherein the digital controller is further configured to:
    supply the second bias current by coupling the first input transistor and the second input transistor to a first current source and a second current source; and
    supply the first bias current by coupling the first input transistor and the second input transistor to the first current source and decoupling the first input transistor and the second input transistor from the second current source.

16. The amplifier of claim 15, wherein the first current source comprises a first P-channel MOSFET with its drain terminal connected to a collector and base or a drain terminal and gate terminal of a third transistor, and wherein the second current source comprises a second P-channel MOSFET with its drain terminal connected to the collector and base of the third transistor.

17. The amplifier of claim 16, wherein the source terminal of the first P-channel MOSFET and source terminal of the second P-channel MOSFET are connected to a common supply voltage.

18. The amplifier of claim 17, wherein the third transistor is an NPN bipolar junction transistor.

19. A method of operating an amplification circuit, the method comprising coupling a base of a first input transistor of the amplification circuit to a positive node of an input port, coupling an emitter of the first input transistor to ground, and coupling the collector of the first input transistor to a positive intermediate node;

coupling a base of a second input transistor of the amplification circuit to a negative node of the input port, coupling the emitter of the second transistor to ground, and coupling the collector of the second amplification circuit to a negative intermediate node;

enabling a selected one of multiple output ports with a first polarity by coupling a positive node of the selected output port to the positive intermediate node and coupling a negative node of the selected output port to the negative intermediate node;

inverting the polarity of the selected output port by coupling the positive node of the selected output port to the negative intermediate node and coupling the negative node of the selected output port to the positive intermediate node; and when m of the multiple output ports are enabled, biasing the bases of the first and second input transistors to provide quiescent current m*I0, wherein the enabling of the multiple output ports with the first polarity or the inverted polarity is associated with an orthogonal phase code that identifies a receive signal corresponding to a receive antenna or identifies a transmit signal corresponding to a transmit antenna.

20. The method of claim 19, further comprising enabling a second of the multiple output ports with the first polarity by coupling the positive node of the second output port to the positive intermediate node and coupling the negative node of the second output port to the negative intermediate node.

* * * * *